US008766842B1

(12) United States Patent
Bertolini et al.

(10) Patent No.: US 8,766,842 B1
(45) Date of Patent: Jul. 1, 2014

(54) ANALOG TO DIGITAL ADDRESS DETECTOR CIRCUIT

(71) Applicant: Maxim Integrated Products, Inc., San Jose, CA (US)

(72) Inventors: Luca Bertolini, Pero (IT); Andrea Milanesi, Milan (IT); Paolo Boi, Certosa di Pavia (IT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/744,891

(22) Filed: Jan. 18, 2013

(51) Int. Cl.
*H03M 1/34* (2006.01)

(52) U.S. Cl.
USPC .......................................... 341/164; 341/158

(58) Field of Classification Search
CPC ............... H03M 2201/4135; H03M 2201/192; H03M 2201/4233; H03M 1/34
USPC .................................................. 341/158, 164
See application file for complete search history.

(56) References Cited

U.S. PATENT DOCUMENTS

| 7,679,345 B1 * | 3/2010 | Verma et al. .................. 323/273 |
| 8,358,231 B2 * | 1/2013 | Killat et al. ................... 341/165 |
| 2002/0126034 A1 * | 9/2002 | Draxelmayr ................... 341/164 |

* cited by examiner

*Primary Examiner* — Khai M Nguyen

(57) ABSTRACT

An analog to digital detector circuit includes a comparator circuit and a counter that generates a digital counter value. A digital to analog converter receives an inverse of the digital counter value of the counter and generates a first voltage. A variable current source receives the digital counter value of the counter and generates a first current.

14 Claims, 5 Drawing Sheets

ANALOG TO DIGITAL ADDRESS DETECTOR CIRCUIT

FIELD

The present disclosure relates to analog to digital address detector circuits.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In some application circuits, an external resistor is connected to a device to program digital information in the device. The external resistor may be used to set an address or specify data to configure a programmable function (either analog or digital). For example only, the programmed information may correspond to an address of a device, a threshold of an internal comparator, or other programmed information.

Some circuits supply a constant current to the external resistor and read a corresponding voltage drop using an analog to digital converter (ADC). FIG. 1 shows an example of a detector circuit 10 including an external resistor 20 that is connected to a current source 34, which supplies a constant current i. An analog to digital converter (ADC) 38 receives a voltage $V_{in}$ and generates an n-bit digital code. The ADC 38 and the current source 34 may be connected to reference voltages $V_{ref1}$ and $V_{ref2}$, which may be the same or different. The tolerance of the external resistor 20 is:

$$\frac{R_{K+1} - R_K}{R_K} = \frac{1}{2^n}$$

SUMMARY

This section provides a general summary of the disclosure, and is not a comprehensive disclosure of its full scope or all of its features.

An analog to digital detector circuit includes a comparator circuit and a counter that generates a digital counter value. A digital to analog converter receives an inverse of the digital counter value of the counter and generates a first voltage. A variable current source receives the digital counter value of the counter and generates a first current.

In other features, the comparator circuit, the counter, the digital to analog converter, and the variable current source are implemented as an integrated circuit. The comparator receives a second voltage generated based on the first current and a value of an external resistor connected to the analog to digital detector circuit. The comparator enables the counter and latches a counter value when the first voltage transitions to a value less than a second voltage input to the comparator.

In other features, the comparator includes an inverting input receiving the first voltage and a non-inverting input receiving a second voltage generated based on the first current and an external resistor. The counter increments a counter value to increase the first current and decrease the first voltage until the first voltage transitions to a value less than a second voltage input to the comparator. The variable current source includes a second digital to analog converter.

An integrated circuit includes a device including a first circuit having a device characteristic. A detector circuit includes a comparator circuit, a counter that generates a digital counter value, a first digital to analog converter that receives an inverse of the digital counter value of the counter and that generates a first voltage, and a second digital to analog converter that receives the digital counter value of the counter and that generates a first current. The comparator receives a second voltage based on the first current and a value of an external resistance. The detector circuit sets a value of the device characteristic based on the value of the external resistance.

In other features, the counter increments a counter value to increase the first current and decrease the first voltage until the first voltage transitions to a value less than a second voltage input to the comparator. The comparator enables the counter and latches a counter value when the first voltage transitions to a value less than a second voltage input to the comparator. The comparator includes an inverting input receiving the first voltage and a non-inverting input receiving the second voltage. The variable current source includes a second digital to analog converter.

A method for setting a device characteristic includes connecting an external resistor to an analog to digital detector circuit; generating a counter value; generating a first voltage based on the counter value; generating a first current based on the counter value; comparing the first voltage to a second voltage generated based on the first current and the external resistor; incrementing the counter value until the first voltage transitions the second voltage cross; and setting the device characteristic based on the counter value when the first voltage and the second voltage cross.

In other features, the method includes latching the counter value when the first voltage transitions to a value less than the second voltage. The method includes incrementing the counter value to increase the first current and decrease the first voltage until the first voltage transitions to a value less than a second voltage.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

DETAILED DESCRIPTION

Figure 1:
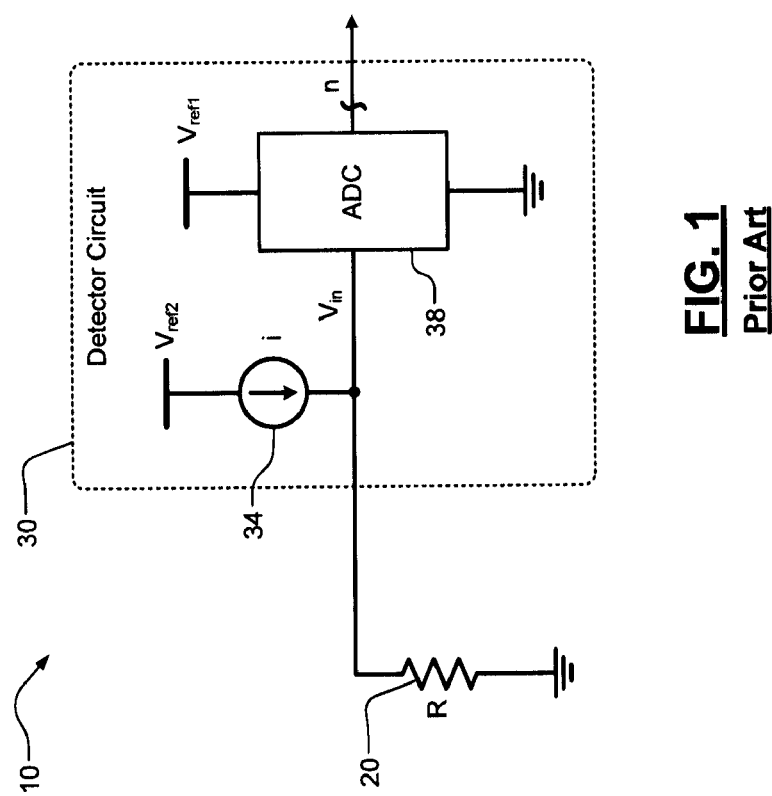
FIG. 1 is an electrical schematic and functional block diagram of an analog to digital address detector circuit according to the prior art.
Figure 2:
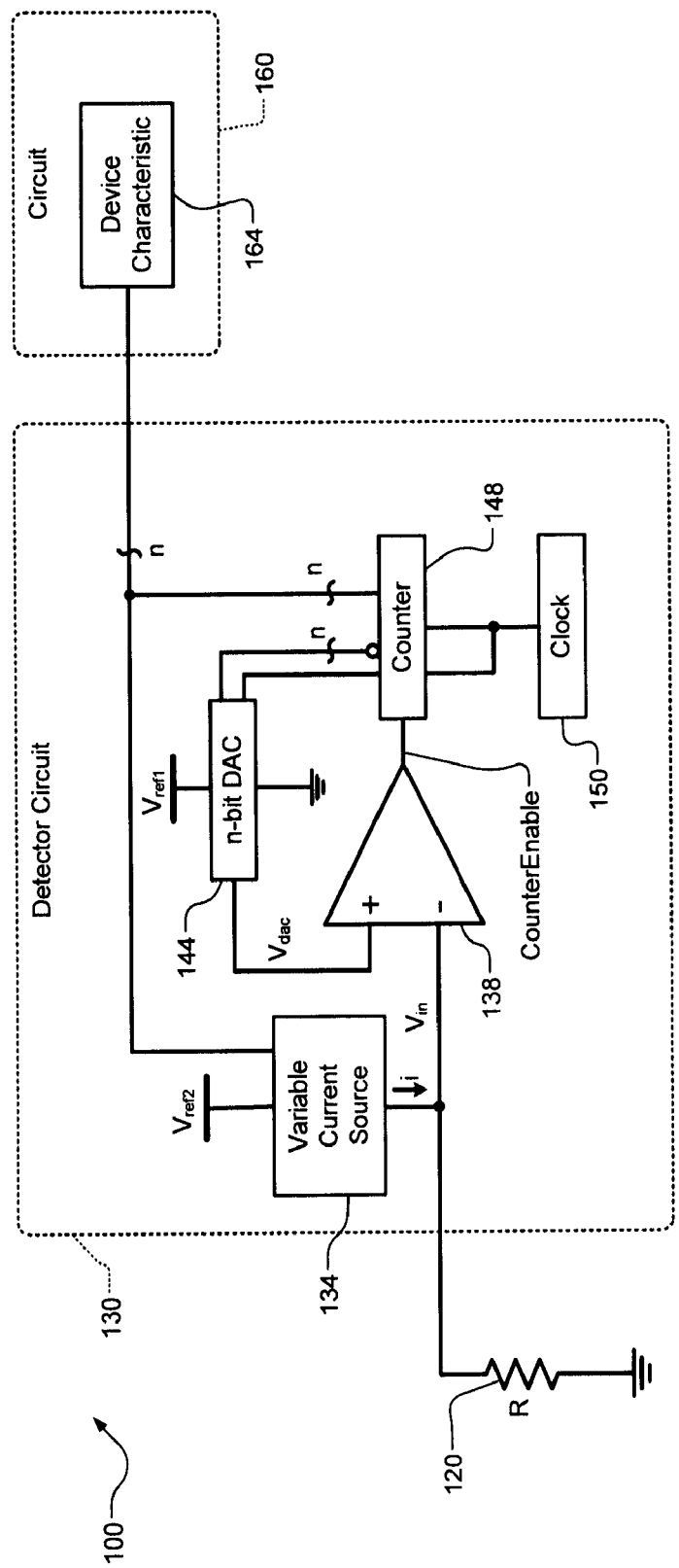
FIG. 2 is an electrical schematic and functional block diagram of an example of an analog to digital address detector circuit according to the present disclosure.

FIG. 2 shows an example of an analog to digital address detector circuit 100 according to the present disclosure. An external resistor 120 is connected to the analog to digital address detector circuit 100 to set an address or specify data as in FIG. 1. The analog to digital address detector circuit 100 further includes a detector circuit 130 including a variable current source 134 providing a variable current i. The variable current source may include a digital to analog converter (DAC) to convert a digital counter value to a current signal.

A voltage drop $V_{in}$ across the external resistor 120 is input to an inverting input of a comparator 138. A non-inverting input of the comparator 138 also receives a voltage output $V_{dac}$ of an n-bit digital to analog converter (DAC) 144. An output of the comparator 138 is input to a counter 148. The counter 148 generates an n-bit output and an inverted n-bit output. The inverted n-bit output is input to the n-bit DAC 144. The n-bit output of the counter 148 is also fed back to the variable current source 134. A clock 150 provides a clock signal to the counter 148 and the n-bit DAC 144. When latched, the output of the counter 148 sets a device characteristic 164 of a circuit 160. In some examples, the analog to digital detector circuit 100 is implemented as an integrated circuit. In some examples, the analog to digital detector circuit 100 and the circuit 160 are implemented as one or more integrated circuits.

Figure 3:
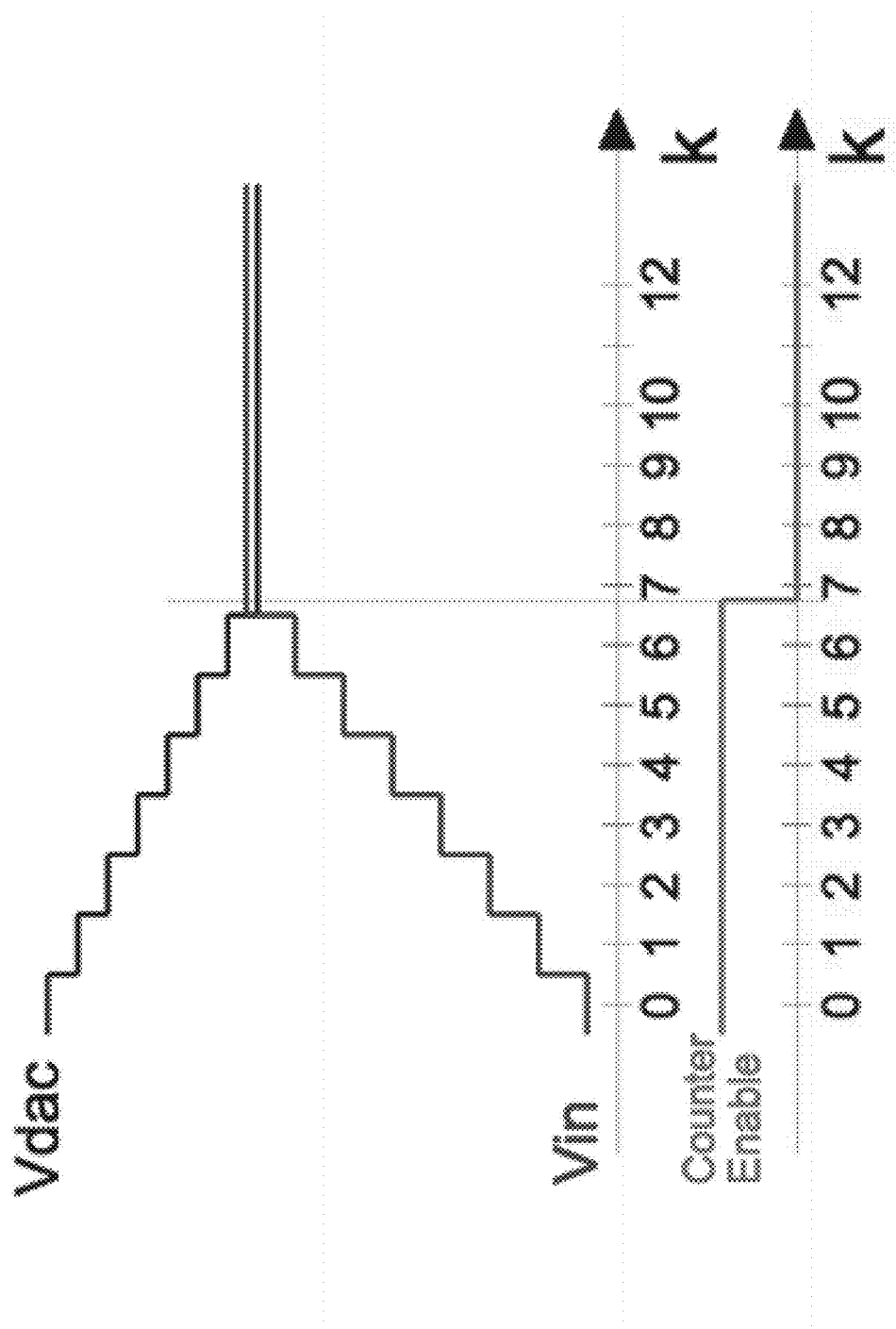
FIG. 3 illustrates a voltage of a digital to analog converter (DAC) and an input voltage during counter steps.

FIG. 3 illustrates a voltage of a digital to analog converter (DAC) and an input voltage during successive counter steps. The counter 148 is reset to zero at the beginning of detection. The voltage $V_{DAC}$ is set to a maximum value, which may be equal to the reference voltage $V_{REF}$. The current i is set to a minimum current value. The counter 148 counts up at each clock event, which may be defined as a clock edge or clock state. Each clock step decreases the voltage $V_{DAC}$ and increases the current i injected into the external resistor 120. During the steps, the comparator 138 determines whether or not $V_{DAC}$ is less than $V_{in}$. When $V_{DAC}$ and $V_{in}$ cross, the counter 148 stops and the output is available as a digital code. If $V_{DAC}$ and $V_{in}$ do not cross after all of the clock steps, the counter 148 stops at a max count value because the external resistor 120 is very low or zero. As can be appreciated, the detector circuit may be operated with the counter initially set to a maximum value and the current value may be decreased from a maximum value while $V_{DAC}$ may be increased from a minimum value. Still other variations may be used.

Figure 4:
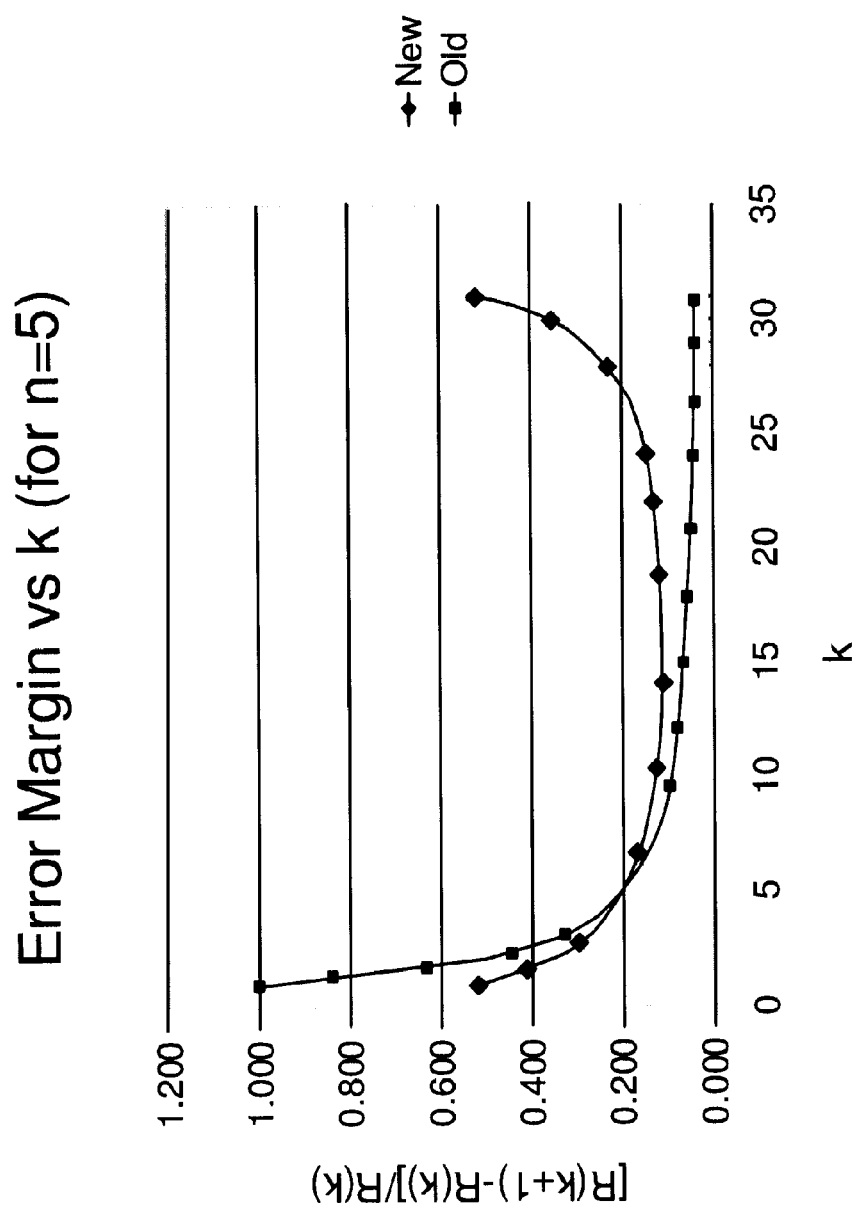
FIG. 4 is a graph illustrating an error margin as a function of output code k.

FIG. 4 is a graph illustrating an error margin as a function of output code k. The resistor tolerance function of the analog to digital detector circuit of FIG. 1 is compared to the analog to digital detector circuit of FIG. 2. The tolerance becomes tighter after code k is >6 and the function minimum occurs in the middle range. The function minimum is about 4 times the one calculated for the analog to digital detection circuit of FIG. 1 ($1/2^n$). Therefore, the analog to digital detector circuit of FIG. 2 allows an address range that is 4 times larger.

More particularly, for a given code, the current will not be a constant. The current is a function of the code as well as the triggering voltage:

$$V_{dac}(k) = V_{ref} \frac{2^n - k + 1}{2^n} \text{ and } i(k) = i \frac{k}{2^n}.$$

To select code k (with: $1<=k<=2^n$), a resistor value is:

$$R(k) = \frac{V_{dac}(k)}{i(k)} = \frac{V_{ref}}{i} * \frac{2^n - k + 1}{2^n} * \frac{2^n}{k} = \frac{V_{ref}}{i} * \frac{2^n - k + 1}{k}$$

The max error allowed on the resistor between a given code and the next code is:

$$\left[\frac{R(k+1) - R(k)}{R(k)}\right] = \frac{2^n + 1}{(k+1)(2^n - k + 1)}$$

A minimum occurs at $k=(2^n/2)$. The minimum error can be calculated as:

$$\left[\frac{R(k+1) - R(k)}{R(k)}\right]_{k=(2^n/2)} = \frac{2^n + 1}{\left(\frac{2^n}{2} + 1\right)^2} \approx \frac{4}{2^n}$$

if $2^n >> 1$; as it is usually the minimum error allowed in the resistor values is about $4/2^n$. Therefore if a maximum error is allowed, the analog to digital address detection circuit addresses a number 4 times larger than the analog to digital address detection circuit in FIG. 1.

Figure 5:
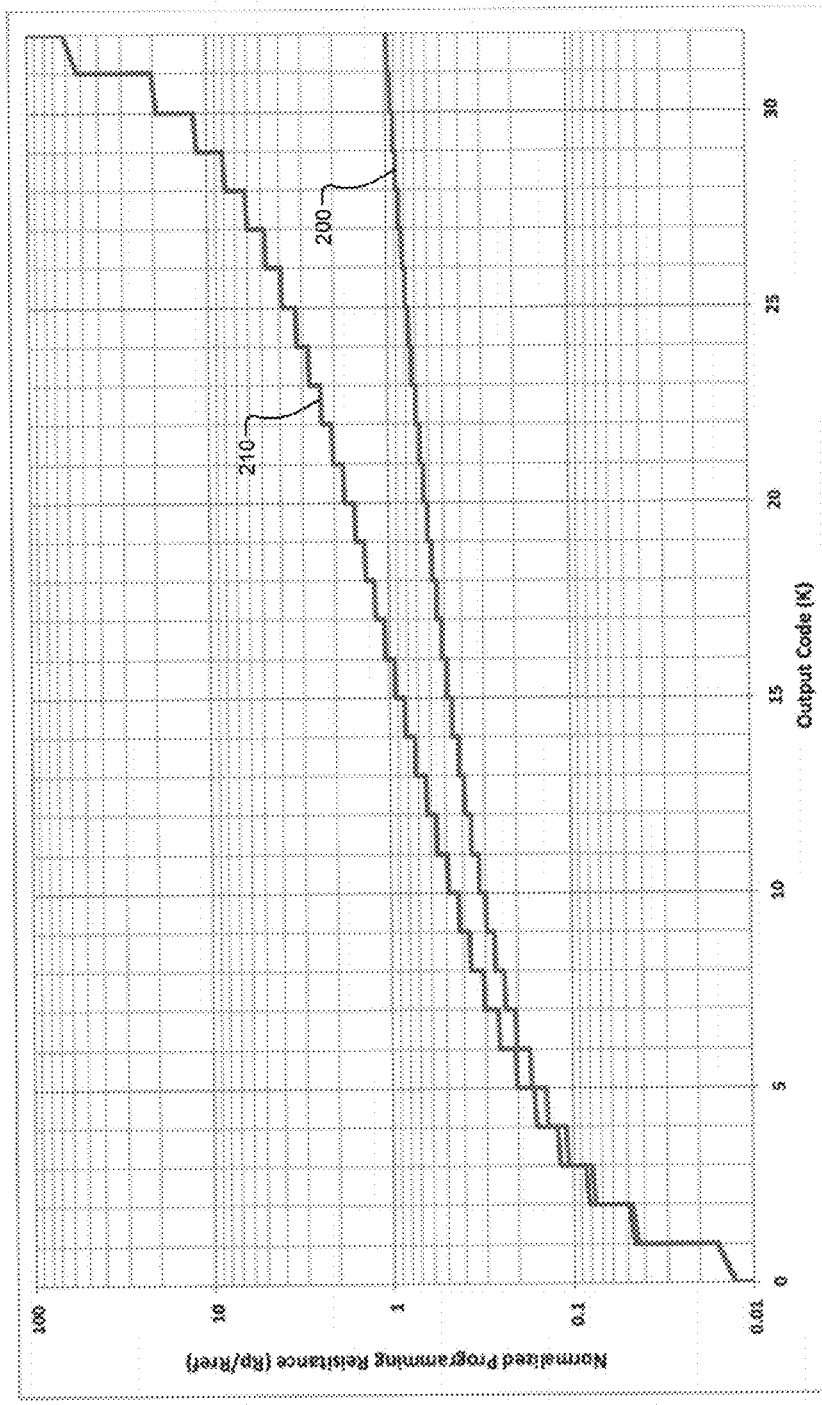
FIG. 5 illustrates normalized programming resistance ($R_p/R_{ref}$) as a function of output code k for the analog to digital address detector circuits of FIGS. 1 and 2.

FIG. 5 illustrates normalized programming resistance ($R_p/R_{ref}$) as a function of output code k for the analog to digital address detector circuits of FIG. 1 (at 200) and FIG. 2 (at 210). The normalized programming resistance for the analog to digital detector circuit of FIG. 1 is $R_p/R_{ref}=k/2^n$ whereas the normalized programming resistance for the analog to digital detector circuit of FIG. 2 is $R_p/R_{ref}=k/(2^n-k)$.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. An analog to digital detector circuit, comprising:
   a comparator circuit;
   a counter that generates a digital counter value;
   a digital to analog converter that receives an inverse of the digital counter value of the counter and that generates a first voltage; and
   a variable current source that receives the digital counter value of the counter and that generates a first current.

2. The analog to digital detector circuit of claim 1, wherein the comparator circuit, the counter, the digital to analog converter, and the variable current source are implemented as an integrated circuit.

3. The analog to digital detector circuit of claim 1, wherein the comparator receives a second voltage generated based on the first current and a value of an external resistor connected to the analog to digital detector circuit.

4. The analog to digital detector circuit of claim 1, wherein the comparator enables the counter and latches a counter value when the first voltage transitions to a value less than a second voltage input to the comparator.

5. The analog to digital detector circuit of claim 1, wherein the comparator includes an inverting input receiving the first voltage and a non-inverting input receiving a second voltage generated based on the first current and an external resistor.

6. The analog to digital detector circuit of claim 1, wherein the counter increments a counter value to increase the first current and decrease the first voltage until the first voltage transitions to a value less than a second voltage input to the comparator.

7. The analog to digital detector circuit of claim 1, wherein the variable current source includes a second digital to analog converter.

8. An integrated circuit comprising:
a device including a first circuit having a device characteristic; and
a detector circuit including:
a comparator circuit;
a counter that generates a digital counter value;
a first digital to analog converter that receives an inverse of the digital counter value of the counter and that generates a first voltage; and
a second digital to analog converter that receives the digital counter value of the counter and that generates a first current,
wherein the comparator receives a second voltage based on the first current and a value of an external resistance, and
wherein the detector circuit sets a value of the device characteristic based on the value of the external resistance.

9. The integrated circuit of claim 8, wherein the counter increments a counter value to increase the first current and decrease the first voltage until the first voltage transitions to a value less than a second voltage input to the comparator.

10. The integrated circuit of claim 8, wherein the comparator enables the counter and latches a counter value when the first voltage transitions to a value less than a second voltage input to the comparator.

11. The integrated circuit of claim 8, wherein the comparator includes an inverting input receiving the first voltage and a non-inverting input receiving the second voltage.

12. A method for setting a device characteristic, comprising:
connecting an external resistor to an analog to digital detector circuit;
generating a counter value;
generating a first voltage based on the counter value;
generating a first current based on the counter value;
comparing the first voltage to a second voltage generated based on the first current and the external resistor;
incrementing the counter value until the first voltage transitions the second voltage cross; and
setting the device characteristic based on the counter value when the first voltage and the second voltage cross.

13. The method of claim 12, further comprising latching the counter value when the first voltage transitions to a value less than the second voltage.

14. The method of claim 12, wherein the incrementing comprises incrementing the counter value to increase the first current and decrease the first voltage until the first voltage transitions to a value less than a second voltage.

* * * * *